July 1, 1952 K. H. MAXEY ET AL 2,601,795

TUNING AND LOCKING TOOL

Filed Dec. 14, 1949

INVENTOR.
Kenneth P. O'Toole
Kenneth H. Maxey
BY
Attorney

Patented July 1, 1952

2,601,795

UNITED STATES PATENT OFFICE 2,601,795

TUNING AND LOCKING TOOL

Kenneth H. Maxey, Davis, and Kenneth P. O'Toole, Vallejo, Calif.

Application December 14, 1949, Serial No. 132,965

2 Claims. (Cl. 81—3)

(Granted under the act of March 3, 1883, as amended April 30, 1928; 370 O. G. 757)

The invention relates to tools and particularly to tools for actuating motor driven tuning elements of tunable electronic equipment.

Tuning elements of electronic equipment are frequently motor driven for tuning the equipment through a given band of frequencies. In order to tune the equipment through a second band of frequencies it is necessary first to disconnect the tuning element from its tuning motor, and then to reset the tuning element by a tuning dial. Since the tuning element normally is connected to the motor through a clutch, it is therefore necessary to actuate the clutch for disengaging the tuning element from the motor before the element can be reset.

In almost all systems of this type, a first manually operable means such as a tuning dial is provided for resetting the tuning element, and a second manually operable clutch actuating means such as an inner dial concentric with the tuning dial, or a locking or clutch-control bar substantially contiguous to and rotatable about the same axis as the tuning dial, is provided for actuating the clutch, the first and second means normally being carried respectively on corresponding ends of coaxial shafts. This latter arrangement including a locking bar is the more common one and will be used herein for illustrating the environment and operation of the invention. In all systems of this type, however, the arrangement of parts is such that the tuning dial is inoperative to reset the tuning element while the tuning element is connected to the tuning motor, and in all of these systems the tuning element can be disengaged from the tuning motor by rotating the clutch-actuating means relative to the tuning dial.

Heretofore, the dial and the bar have either been actuated by hand or by means of separate tools, one for engaging the dial, the other for engaging the bar. In either event, the operation has proved awkward, and it is a prime object of the invention to provide a device that will easily and accurately enable an operator to actuate the dial and bar.

Briefly, the invention comprises means for engaging a tuning dial and means for engaging a clutch control element such as a locking bar, the second named means being rotatably and reciprocably carried by the first named means. In order that the dial can be engaged by the tool without simultaneous engagement of the bar, spring means are provided for urging the bar-engaging means from a bar engaging position into a withdrawn or bar disengaging position.

Figure 1:
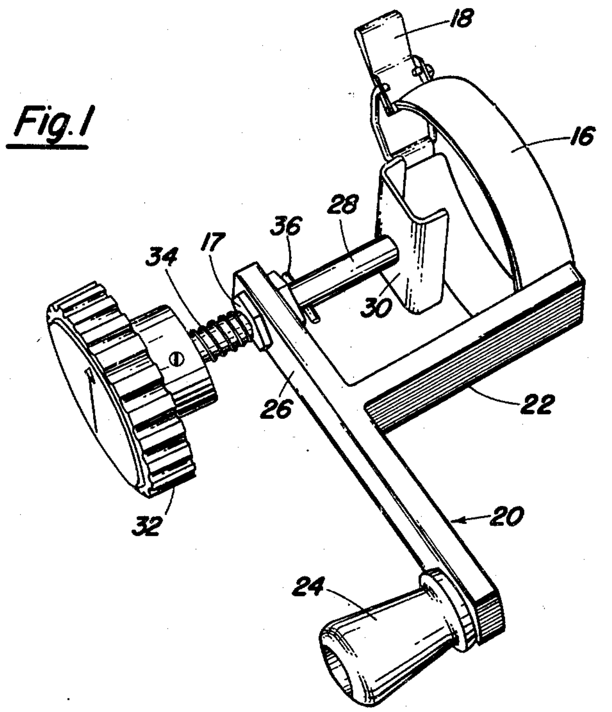
Figure 2:
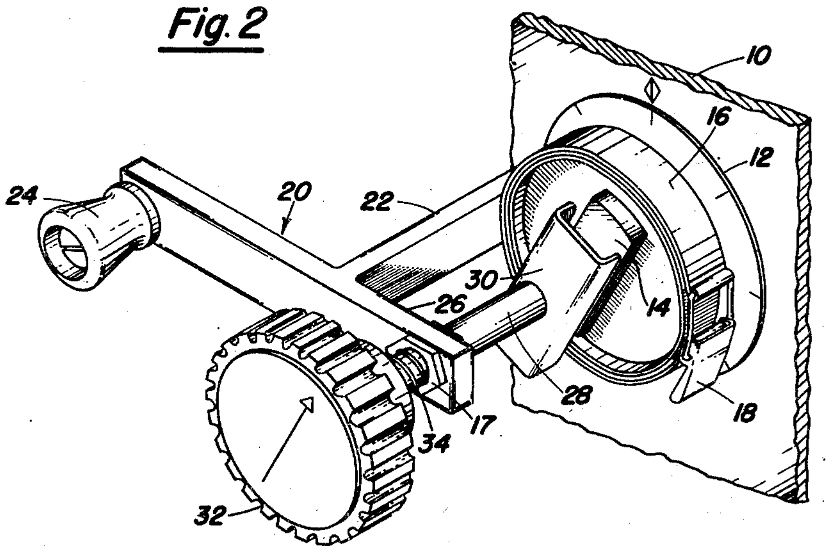

For a better understanding of the invention, reference is made to the following specification of a presently preferred embodiment of the invention, said specification to be read in connection with the accompanying drawings, wherein Fig. 1 is a perspective view of a device embodying the invention, and Fig. 2 is a perspective view of the device of Fig. 1 mounted on the control elements of an electrical device.

Reference is now made to the drawings, wherein there is illustrated a panel board 10 carrying a tuning dial 12 and a clutch control or locking bar 14, said dial and bar being respectively carried on coaxial shafts (not shown) and therefore being rotatable about a common axis. For the purpose of illustrating the invention, it will be assumed that when the dial and bar are in the positions shown, a tuning element connected thereto will be engaged with a tuning motor through a clutch, and that when the locking bar is rotated counterclockwise through 90° the clutch will be operated for disengaging the tuning element from the tuning motor. It will be further assumed that when the dial and bar are in the positions shown in the drawing, tuning of the tuning element is controlled solely by the tuning motor, to the exclusion of the tuning dial, and that when the bar is rotated counterclockwise through 90° to disengage the tuning element from the tuning motor, the tuning element is controlled solely by the dial.

The invention includes two parts: a dial-engaging part and a bar-engaging part, the bar-engaging part being rotatably and reciprocably mounted on the dial-engaging part. The dial engaging part includes a cylindrical friction band 16 engageable with the dial 12 by means of a toggle clip 18. A crank arm 20 for rotating the dial 12 when it is engaged by the band 16 is fixed to the band through an upright 22, and is provided with a handle 24. A portion 26 of the crank arm 20 extends past the center of the band 16, and is apertured at the intersection of the axis of the band 16 with the crank arm for receiving a bushing 17 coaxial with band 16. A shaft 28 of the bar-engaging part of the device is received within bushing 17 for rotation about and reciprocation along the axis of the band 16. A bar-engaging jaw 30 is fixed to one end of the shaft and a knob 32 is fixed to the other end. Since it is desirable that the dial-engaging part of the device be usable independently of the bar-engaging part, means such as compression spring 34 positioned about shaft 28 between arm 20 and knob 32 is provided for urging the bar-engaging part of the device from a bar engaging position into a bar disengaging position axially withdrawn from the band 16, which withdrawn position of the bar-engaging part is illustrated in the drawings. A pin 36 is fixed in shaft 28 for limiting the displacement of the shaft under the urging of the spring.

As mentioned hereinabove, the specific embodiment illustrated and described herein of the invention was selected because a locking bar is most commonly used in clutch control mechanisms. It will be apparent that jaw 30, which is well suited to engage a bar, could be replaced by a pronged wrench, a socket wrench, an "Allen" wrench, a screw driver tip, or other type of torque-applying means adapted to fit any particular configuration of clutch-actuating elements.

*Operation*

In using the device, the band 16 is first clamped firmly about the dial 12 by means of clip 18. The jaw 30 is then moved against the action of the spring 34 to engage the locking bar 14, which bar is then rotated counterclockwise through 90° to disengage the tuning element from the tuning motor. The knob 32 is then released and the jaw 30 is moved away from the bar 14 by the action of spring 34. The dial 12 is then rotated to the new setting by crank arm 22. After the tuning element has been reset by the dial, the bar 14 is then rotated clockwise through 90° by means of jaw 30 for re-engaging the tuning element with the motor. If necessary, the crank can be firmly held during this re-engaging step for preventing accidental displacement of the tuning element from its reset position. The device is then removed from the dial.

Obviously many modifications and variations of the present invention are possible in the light of the above teachings. It is therefore to be understood that within the scope of the appended claims the invention can be practiced otherwise than as specifically described.

The invention described herein may be manufactured and used by or for the Government of the United States of America for governmental purposes without the payment of any royalties thereon or therefor.

What is claimed is:

1. A device for use with a system including a tuning dial and a locking bar, said device including a cylindrical friction band for engaging said tuning dial, a crank arm with a crank handle carried by said friction band for rotating said dial, a jaw for actuating said locking bar, and means carried by said crank arm offset from the point of attachment of said crank arm to said friction band and lying substantially axially of said friction band attached to said jaw for rotating said jaw about and reciprocating it along the axis of said band whereby, when the dial is engaged by the friction band, the bar can be engaged with the jaw.

2. The device according to claim 1, and means for urging said jaw into an axially withdrawn position.

KENNETH H. MAXEY.
KENNETH P. O'TOOLE.

REFERENCES CITED

The following references are of record in the file of this patent:

UNITED STATES PATENTS

| Number | Name | Date |
|---|---|---|
| 864,103 | Mulroyan | Aug. 20, 1907 |
| 1,467,535 | Despres | Sept. 11, 1923 |
| 1,544,520 | Putrow | June 30, 1925 |
| 1,677,473 | Gast | July 17, 1928 |
| 2,055,262 | Queen | Sept. 22, 1936 |